United States Patent [19]

Walter

[11] Patent Number: 4,721,993
[45] Date of Patent: Jan. 26, 1988

[54] INTERCONNECT TAPE FOR USE IN TAPE AUTOMATED BONDING

[75] Inventor: Jackie A. Walter, Sunnyvale, Calif.
[73] Assignee: Olin Corporation, Virginia, Conn.
[21] Appl. No.: 824,894
[22] Filed: Jan. 31, 1986
[51] Int. Cl.$^4$ .................. H01L 23/48; H01L 21/88
[52] U.S. Cl. ........................................ 357/70; 357/68
[58] Field of Search .............................. 357/70, 68

[56] References Cited

U.S. PATENT DOCUMENTS

| | | | |
|---|---|---|---|
| 3,519,890 | 7/1970 | Ashby | 357/70 |
| 3,902,148 | 8/1975 | Drees et al. | 357/70 |
| 4,109,096 | 8/1978 | Dehaine | 357/70 |
| 4,234,666 | 11/1980 | Gursky | 357/70 |
| 4,331,740 | 5/1982 | Burns | 357/70 |
| 4,400,714 | 8/1983 | Brown | 357/70 |
| 4,496,965 | 1/1985 | Orcutt et al. | 357/70 |

OTHER PUBLICATIONS

"TAB Technology Tackles High Density Interconnections" by Tom Dixon, Dec. 1984, volume of *Electronic Packaging & Production* at pp. 34–39.

Primary Examiner—James, Andrew J.
Assistant Examiner—Jackson Jr., Jerome
Attorney, Agent, or Firm—Paul Weinstein

[57] ABSTRACT

An improved interconnect tape for use in tape automated bonding comprising a carrier member for supporting at least one pattern of interconnect leads. At least one first ring is provided having a plurality of sides with each of the sides supporting the leads extending inwardly of the member. Yieldable portions connecting the ring to the carrier member provide reduced stresses in the leads and reduced thermal dissipation during inner lead bonding.

18 Claims, 4 Drawing Figures

INTERCONNECT TAPE FOR USE IN TAPE AUTOMATED BONDING

This invention relates to an improved interconnect tape for use in tape automated bonding (hereinafter referred to as TAB). A general review of TAB technology is set forth in an article entitled "TAB Technology Tackles High Density Interconnections" by Tom Dixon, which appeared in the December, 1984, volume of *Electronic Packaging & Production* at pages 34-39. TAB technology comprises an interconnect technology used to interconnect a semiconductor device to a leadframe, semiconductor package contacts or a printed circuit board. In most cases, TAB is used instead of conventional wire bonding technology. TAB is finding increased use commercially because of the trend toward increased circuit density. TAB permits closer spacing of interconnect bonding pads on the semiconductor die than would be achievable by wire bonding.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a leadframe, circuit board, etc., as desired. In the single layer version, a metal frame supports the elongated leads; whereas, in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired leadframe, package circuitry or printed circuitry, as desired. The TAB leads are formed from a metal foil such as copper foil and are relatively thin, namely one-half to six mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermocompression bond between the inner lead portion of the TAB leads and the chip. Bumped tapes eliminate the need for bumping of the wafer and, therefore, permit the TAB interlead bond portions to be bonded directly to ordinary semiconductor die bonding pads. The bumped tape normally has a copper projection or bump positioned at the point where it is to be joined to the die. This bump may, if desired, be covered with a suitable plating such as gold, tin or nickel.

During inner lead bonding, problems arise utilizing TAB technology due to the difference in coefficient of thermal expansion of the TAB interconnect as compared to the electronic device or semiconductor chip to which the inner leads are bonded. At the time of inner lead bonding, the interconnect leads remain attached to the TAB carrier. Therefore, this difference in coefficient of thermal expansion causes stresses to build up in the leads, which can cause poor inner lead bonding in the first instance or breaking of bonds during further handling. Further, particularly with single layer metal tapes, the good thermal conductivity of the TAB interconnect carrier and leads result in heat required for inner lead bonding being dissipated by conduction through the leads and the interconnect tape support structure. Both of these problems can seriously impact the viability of TAB technology since it is essential that the technology provide reliable inner lead bonds. This is especially the case since TAB technology finds its most beneficial application with respect to high lead count semiconductor devices, which are relatively expensive. Losses due to failed inner lead bonds with such expensive devices are clearly undesirable and not acceptable.

The stress build up problem in the interconnect leads has been recognized and a number of approaches for reducing the problem have been tried as exemplified in U.S. Pat. No. 3,519,890 to Ashby, U.S. Pat. No. 3,902,148 to Drees et al., U.S. Pat. No. 4,109,096 to Dehaine and 4,234,666 to Gursky. The approaches outlined in these patents involve providing the interconnect leads with yieldable portions which yield under the aforenoted stresses to reduce them. The approaches set forth in these patents are effective for reducing stresses in the leads during inner lead bonding. However, since the yieldable structures are incorporated in the leads themselves they substantially reduce the opportunity for providing interconnect tapes having very high lead counts. When the interconnect tape includes very high lead counts on the order of 100 leads or more, it is not desirable to utilize the stress reducing approaches of the aforenoted patents. Further, the stress reducing approaches of these patents may not have a substantial effect on the thermal dissipation problem previously described since each of the leads is still directly connected to the tape carrier.

A prior art alternative which has been suggested as a means for reducing the stress and thermal dissipation problems while allowing for high lead counts in the interconnect tape is to employ a ring connected at its corners by tabs to the interconnect tape carrier with the leads extending inwardly from the sides of the ring. The thought was that by connecting the ring to the carrier only at the corners the thermal dissipation would be reduced. Further, the unsupported sides of the ring would be sufficiently yieldable to reduce stresses. Since this approach does not involve the leads themselves, which are only connected to the ring at their bases, high lead counts are possible. It has been found that even this approach is not adequate to fully solve the problems which have been identified. The stress relieving properties provided by the ring structure are not uniform since the sides of the ring can yield more readily in the middle than at the corners where they are interconnected with the carrier. Therefore, leads toward the corners are not sufficiently stress relieved, which is clearly undesirable. While thermal dissipation is reduced, it is not sufficiently reduced by this approach to overcome the bondability problems associated with thermal dissipation.

U.S. Pat. No. 4,331,740 to Burns is cited because it discloses a tab interconnect tape having an inner ring structure from which the interconnect leads inwardly extend. It is not believed that the ring structure disclosed in this patent would be effective for overcoming the stress and thermal dissipation problems discussed hereinbefore. The interconnections between the ring and the carrier do not appear to be sufficiently yieldable to reduce stresses and do not appear to be configured to reduce thermal dissipation during inner lead bonding.

In accordance with this invention, an improved interconnect tape for use in tape automated bonding comprises a carrier member for supporting at least one pattern of interconnect leads. At least one first frame member is provided having a plurality of sides with each of the sides supporting a plurality of elongated interconnect leads extending inwardly of the first frame member. First means is provided for reducing stresses in the leads and for reducing thermal dissipation during bonding of the inner lead portions to an electronic device such as a semiconductor chip. The first means comprises a plurality of spaced apart yieldable members connecting each of such sides of the first frame member to the carrier member.

Preferably, the first frame member includes yieldable portions connecting each of the sides to adjacent sides so that each side can yield relative to the carrier member over substantially its entire length. Preferably, a second means is provided for further reducing the stresses and the thermal dissipation during inner lead bonding. The second means comprises at least one second frame member supported by the carrier member so that the first means connects the first frame member to the second frame member. Preferably, the second frame member is supported by the carrier member by means of a plurality of widely spaced apart members substantially fewer in number than the yieldable members of the first means.

The yieldable members may have any desired configuration, which will allow them to collapse or expand as required by the stresses applied to the interconnect leads. The problems of the prior art approaches are overcome in accordance with this invention by providing more uniform yieldability for the first frame member sides supporting the leads and by further reducing the available thermal dissipation paths.

It is an aim of the present invention to provide an improved interconnect tape for use in tape automated bonding which avoids the problems and difficulties encountered by the prior art approaches.

It is a further aim of this invention to provide such an interconnect tape which improves the reliability of inner lead bonding by reducing stresses in the leads and by reducing thermal dissipation during bonding.

It is yet a further aim of this invention to provide an interconnect tape as above including one or more ring members and yieldable members.

These and other aims and advantages will become more apparent from the following description and drawings.

Figure 1:
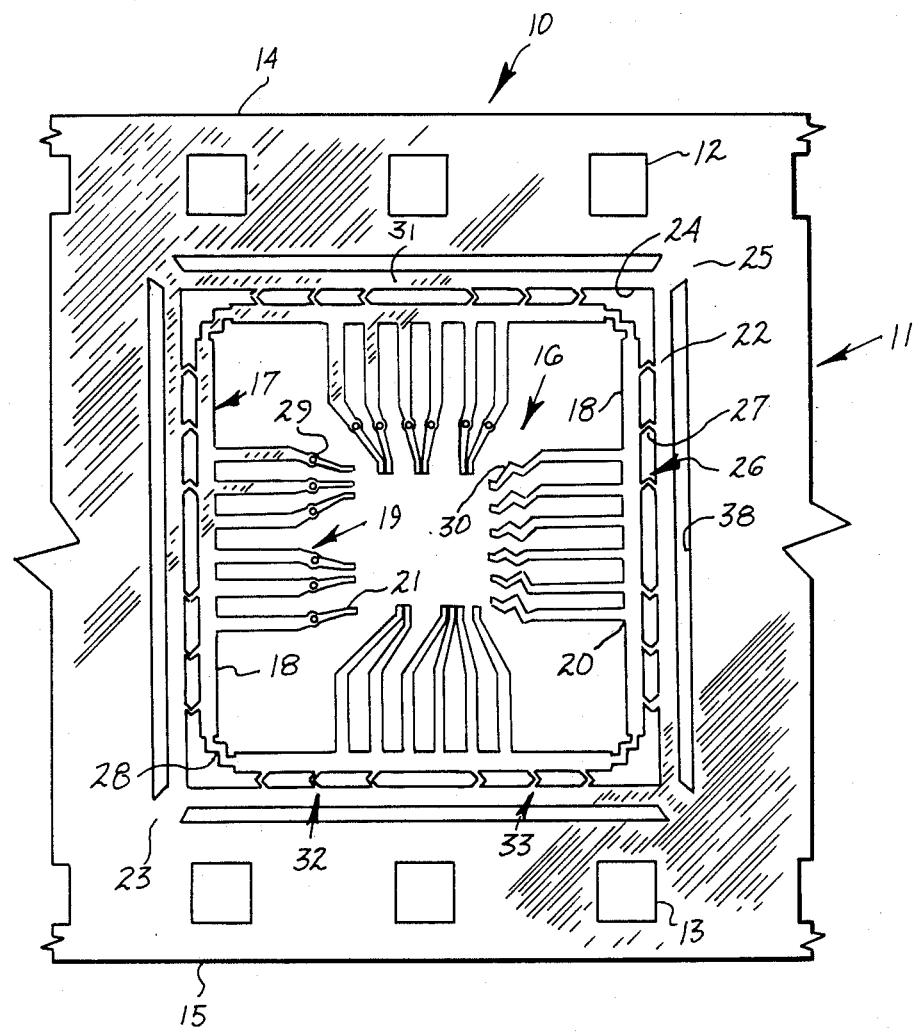
FIG. 1 is a top view of a portion of an interconnect tape in accordance with a preferred embodiment of the present invention.

Referring now to FIG. 1, there is shown by way of example an improved interconnect tape 10 in accordance with a preferred embodiment of the present invention. In the embodiment of FIG. 1, an all metal tape 10 is shown comprising a single layer tape. It is within the scope of this invention to apply it to multi-layer tapes, as will be described hereafter, including the two and three layer varieties.

The tape 10 comprises a metal foil such as copper foil, however, any desired metal could be utilized. The tape 10 comprises a carrier member 11 having two rows of sprocket holes 12 and 13 extending longitudinally adjacent opposing longitudinal edges 14 and 15 of the carrier member 11. The use of such sprocket holes in TAB type tapes is conventional and permits operations on the tape to be properly registered by reference to the sprocket holes. Only one portion or segment of the tape 10 is shown in FIG. 1 carrying a single interconnect lead pattern 16. Each interconnect lead pattern 16 is adapted for connection to an electronic device such as a semiconductor chip. The tape 10 would generally extend for a desired length in a longitudinal sense and contain a plurality of interconnect lead patterns 16 longitudinally spaced apart along its length. For purposes of describing the invention herein, however, only a portion of the tape is shown having a single interconnect lead pattern 16.

A first frame member 17 is comprised of four sides 18 arranged generally in the shape of a square. However, it is within the scope of this invention for the frame member 17 to have any desired number of sides 18 or shape. The frame member 17 supports a plurality of elongated interconnect leads 19 at their outer leads 20. The leads 19 extend inwardly of the frame member 17 in a cantilever fashion. The free ends 21 of leads 19 are adapted to be bonded to bonding pads or bumps of the electronic device as inner lead bonds. The free ends 21 of the leads 19 may be bumped or unbumped as desired for bonding to respective bumped or unbumped contact pads of semiconductor devices.

A second frame member having a generally square shape although it may have any desired shape is arranged about the first frame member and is spaced therefrom. The second frame member is supported by the carrier member and is arranged between the carrier member 11 and the first frame member 17 and is spaced apart from both. The second frame member 22 is supported by the carrier member 11 by means of a plurality of widely spaced apart support members or tabs 23. In the embodiment of FIG. 1, four tabs 23 are arranged connecting the respective corners 24 and 25 of the second frame member and carrier member 11, respectively.

A first means 26 for reducing stresses in the leads and for reducing thermal dissipation during bonding of the inner portions 21 of the leads 19 to an electronic device comprises a plurality of spaced apart yieldable members 27 which connect each side 18 of the first frame member 17 to the carrier member 11. In the embodiment shown, six such yieldable members 27 connect each side 18 to the carrier member 11.

The first frame member 17 preferably includes yieldable portions 28 connecting each side 18 to an adjacent side whereby each side can yield generally uniformly relative to the carrier member 11 over substantially its entire length.

The leads 19 may include means for reducing residual stresses 29 or 30 as are known in the art arranged within the leads themselves. The interconnect lead pattern 16 shown in FIG. 1 deliberately has been illustrated to exemplify a variety of lead 19 types. Ordinarily, if an inlead means for reducing stresses 29 or 30 were chosen, the desired approach would be uniformly used throughout all the leads 19 of the pattern. The inlead stress reliefing means 29 is analogous to that disclosed in the Dehaine and Burns patents noted previously. The inlead stress reducing means 30 is analogous to that disclosed by Drees et al. Any desired lead shape as are known in the TAB art could be employed as well as any desired inlead stress relieving device. The use of an inlead stress relieving means 29 or 30 is optional and it is unlikely that such inlead stress relieving means could be employed in high lead count TAB interconnect tapes 10.

Having thus discussed the structure of the TAB interconnect tape 10 in FIG. 1, further details concerning the benefits provided in accordance with this invention by such a structure and the various alternatives which might be considered will now be described.

The second frame member 22 connected by tabs 23 to the carrier member 11 could correspond to the prior art alternative for reducing stress and thermal dissipation problems described in the background of this application if the leads 19 were directly attached to this ring 22 instead of to the first ring 17. The reason for bringing this up at this time is to illustrate the difficulties associated with such an approach. Since the corners 24 of the second ring 22 are solid and are connected by straight tabs 23 to the carrier member 11 they are not as yieldable as members 27. In contrast, the sides 31 of the ring 22 centrally between the corners 24 are yieldable since they are unsupported. Were leads 19 to extend from a substantial portion of the side 31 leads towards the middle of a side 31 would achieve greater stress relief than leads adjacent the corners 24. This is highly undesirable and fails to overcome the stress problem particularly in high lead count TAB interconnect tapes 10.

In contrast, in accordance with this invention the first ring 17 preferably includes yieldable portions 28 connecting each side 18 to an adjacent side. The yieldable portions 28 are adapted to be crushed or expanded as dictated by the stresses applied to the leads 19. This allows each side 18 to move under the action of the applied stresses over substantially its entire length. Accordingly, it is preferred in accordance with this invention to connect the sides of the ring 17 supporting the leads 19 by a yieldable portion 28 which will permit each side to yield generally uniformly over substantially its entire length to reduce stresses.

In accordance with this invention, the connection between the ring 17 and the ring 22 comprises a plurality of yieldable members 27. In the embodiment shown these members have an angle shape with the bisector of the angle extending generally parallel to the sides 18 and 31. Six yieldable members 27 are used to connect each side 18 to each side 31. In the embodiment shown, the six members 27 are divided into two groups 32 and 33. The group 32 have the vertices of the angle members 27 facing the yieldable corner portion 28 of the ring 17 nearest it. Whereas, the group 33 have their respective vertices in the same direction facing the opposing corner portion 28. This arrangement is believed to provide generally uniform yielding under the stress applied to the leads 19 of the respective sides 18 of the ring 17 over substantially their entire length. By having the angles of the group 32 oriented oppositely to those of the group 33, the position of the side 18 is maintained parallel to the side 31. If the angle members 27 were all oriented in the same direction, there might be a tendency to deflect the side 18 relative to the side 31.

Figure 2:
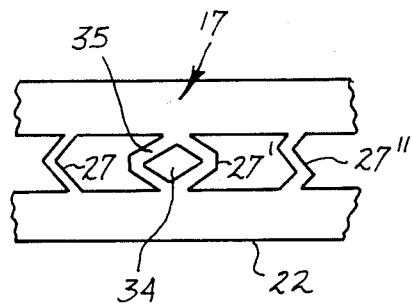
FIG. 2 is a partial top view showing a plurality of alternative yieldable member configurations for connecting a first ring member to a second ring member.

The embodiment shown in FIG. 1, comprises a preferred embodiment. While six connecting members 27 are shown connecting each side 18 of the inner ring 17 to the respective side 31 of the middle ring 22, any desired number of yieldable members 27 could be employed. Further, as shown by reference to FIG. 2, the yieldable members 27 may have any desired shape which is capable of expanding or contracting. For example, the yieldable members 27 could comprise an open diamond structure 27' as shown in FIG. 2. The yieldable member 27' includes an opening 34 which permits the sides 35 of the member 27' to squeeze together or pull apart to provide the desired yielding effect. Alternatively, the yieldable member 27 could comprise a serpentine structure 27" as shown in FIG. 2 wherein the member has a zigzag shape extending between the rings 17 and 22. This also permits the member to expand or contract under the influence of the stresses applied to the leads 19.

Further, any desired member 27 could be employed which would provide the desired yielding effect. Where the member is non-symmetric as with the use of the zigzag or the angle, it is preferred to arrange the members in groups 32 and 33 so as to reverse their respective orientations in order to balance the connection between the rings 17 and 22 to prevent deflection of one relative to the other.

As used herein, primed reference numbers refer to elements having like function and corresponding reference numbers are used for like elements.

While the connecting portions 27 are shown connecting the first ring 17 to the second ring 22, it is within the broad aspects of the present invention that those connecting portions could connect the first ring 17 directly to the carrier member 11 rather than to ring 22. In such a case, most of the benefits of the present invention would still be achieved since the ring 17 would be yieldable in much the same fashion whether it was connected to the ring 22 or to the carrier member 11. However, the use of the ring 22 is preferred since it does provide some additional yieldability and further reduces the thermal dissipation problems. Still further, it may be possible to employ an inner ring 17 without the yieldable portions 28 though this is clearly not preferred since solid corners would clearly affect the yieldability of the sides 18 near the corners of ring 17.

Figure 3:
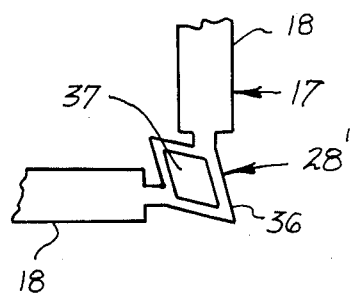
FIG. 3 is a partial top view of an alternative yieldable portion connecting respective sides of a first ring member.

The yieldable portions 28 can have any desired structure. The W shaped portions shown are merely for purpose of illustration. For example, referring to FIG. 3, a yieldable portion 28' is shown as an alternative. The yieldable portion 28' comprises a diamond shape portion having sides 36 and opening 37. This type of structure would allow movement of each side 18 relative to the other in almost any direction in a x-y plane. It is within the limits of the present invention to use any desired yieldable portion 28 or 28' and the specific portions 28 and 28' disclosed are intended merely as examples, though the W shape portion is believed to be most preferred in accordance with this invention.

The yielding function of the first ring 17 and associated yieldable members 27 and yieldable portions 28 has been clearly described. Since the yieldable members 27 have relatively small cross-sectional areas they serve to reduce the thermal dissipation during inner lead bonding. They also provide a tortuous path for heat conduction from the inner leads 19 to the carrier member 11.

The middle ring 22 serves to further enhance the yieldability of the inner ring 17 since the middle ring 22 will yield between the corners 24 over substantially the entire length of the sides 18. Further, since the middle ring 22 is only connected to the carrier member 11 at the corners by the tabs 23, the opportunities for heat dissipation between the inner ring and the carrier member are further reduced due to the further reduction in cross-sectional area of the heat conducting path and the even more tortuous path which must be followed by the heat conduction.

The embodiment of FIG. 1 comprises the most preferred embodiment of the present invention wherein at least two rings 17 and 22 are employed. The use of two rings provides much improved stress relief and much reduced thermal dissipation as compared to the use of a single ring structure. In accordance with this invention, the ring 22 could have the same structure as the ring 17 or alternatives thereof. Further, instead of attaching the ring 22 to the carrier member 11 by corner tabs 23 it could be attached by yieldable corner tabs or by yieldable members 27 connecting the sides 31 of the ring 22 to the sides 38 of the carrier member 11.

While the use of two rings 17 and 22 is preferred in accordance with this invention, it is possible to utilize a single ring structure 17 connected by yieldable members 27 directly to the sides 38 of the carrier member 11. This would still provide improved stress relief action as compared to prior art aproaches although it would not provide as improved reduced thermal dissipation behavior as with the two ring approach which is shown. Further, it is within the limits of the present invention to employ more than two rings to further reduce stresses and thermal dissipation. To even further reduce stresses, it is possible in lower lead count devices to employ yieldable portions 29, 30 or any other desired shape within the leads themselves in addition to the use of the ring structures in accordance with this invention. It is within the scope of the present invention for the ring 22 to have the same structure as the ring 17 and be connected to the corner by corner tabs 23 (preferably yieldable) or yieldable members 27 connecting sides 31 to sides 38.

While the invention has been described by reference to a single layer metal tape, it could be applied to two and three layer tapes, if desired. In a two or three layer tape, the carrier member 11 would comprise a polyimide and the ring structure shown comprising rings 17 and 22 or the like would be arranged within an aperture in the polyimide. The ring structure could be supported in the same manner as shown in FIG. 1 if the foil overlied the polyimide at least between the rows 12 and 13 of sprocket holes. Alternatively, if desired, the tabs 23 could merely be extended onto the polyimide carrier 11 to provide such support. Such a structure would still be very useful for reducing stresses though the thermal dissipation problems may not be as severe with polyimide carrier structures.

Figure 4:
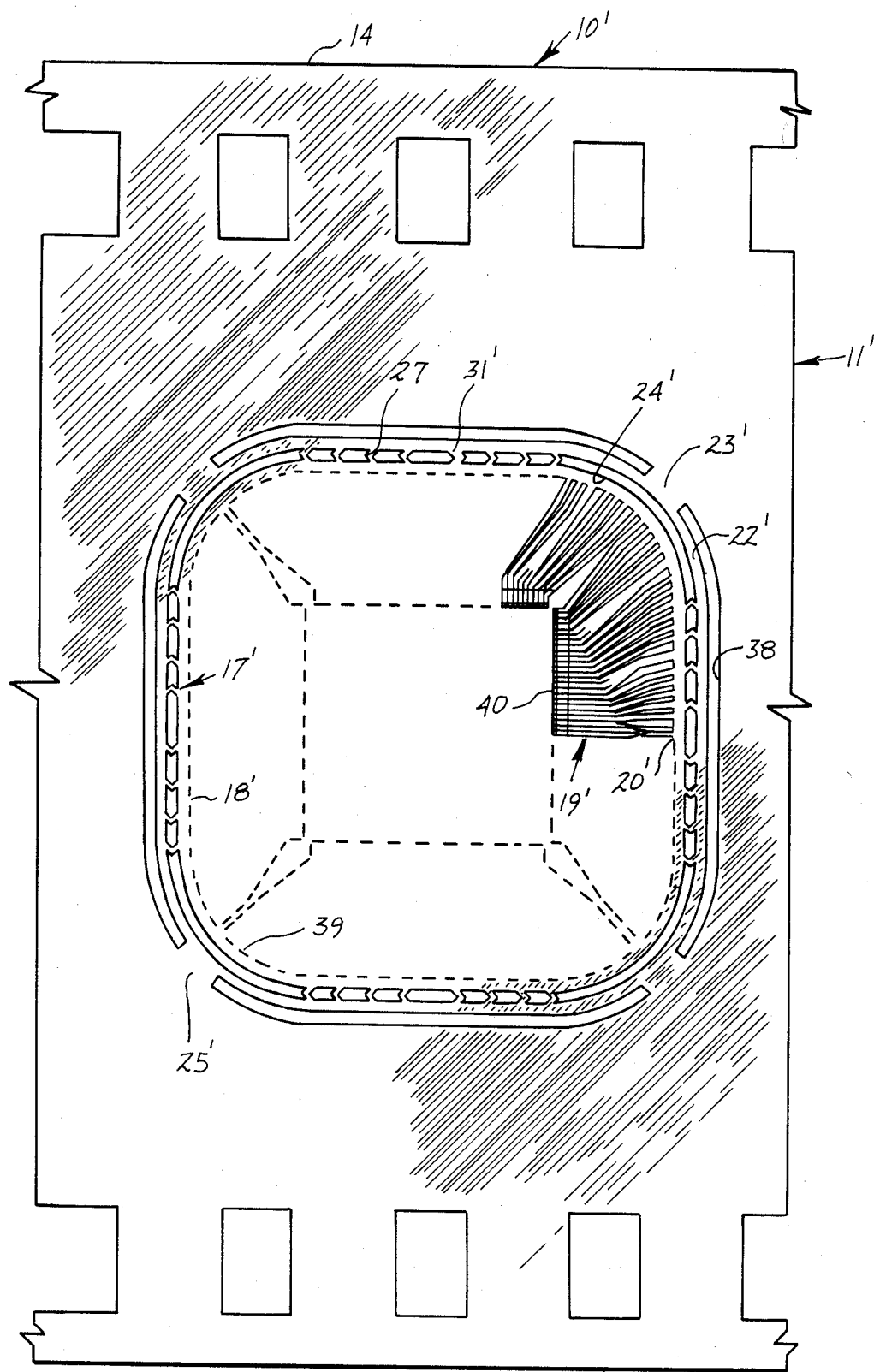
FIG. 4 is a top view of a portion of a high lead count interconnect tape in accordance with an alternative embodiment of the present invention.

Referring now to FIG. 4, a less preferred embodiment in accordance with the present invention is shown. This embodiment enjoys the advantages with respect to reducing thermal dissipation of the two ring structure described by reference to FIG. 1. However, in contrast to the approach of FIG. 1, yieldable portions 28 are not included in the solid inner ring 17' so that the inner ring 17' is similar to the middle ring 22'.

The interconnect tape 10', shown in FIG. 4, is intended for use with a high lead count semiconductor device. The tape 10' shown in FIG. 4 is adapted to make more than 150 interconnections. In order to simpify the drawing of FIG. 4, only a portion of the leads 19' are shown in solid lines. The remainder of the lead pattern is outlined in phantom.

In view of the exceptionally high lead count of the tape 10' it was necessary to use the corners 39 of the inner ring 17' for supporting leads 19'. Accordingly, in this particular structure it was determined that yieldable portions 28 as in FIG. 1 would not be included. In order to provide a better support for the bases 20' of the leads 19', the corner portions 39 were given a curved or arcuate shape as shown. The ring 22' was given a corresponding arcuate shape at its respective corners 24'. The carrier member 11' was correspondingly shaped to provide arcuate or curved corners 25'. Yieldable members 27 were employed as in the previously discussed embodiment to connect the ring 17' to the ring 22'. In this embodiment eight yieldable members connect each side 18' of the ring 17' to the respective side 31' of the ring 22'. The additional yieldable members are included to provide more uniform yielding over the length of the side as well as to provide additional support for the high lead count lead pattern 19'. The leads 19' include bumps 40 at their free ends. However, if desired, the lead pattern need not include bumps. These bumps are intended to assist in bonding and provide a mechanical standoff for the leads over the semiconductor chip. Finally, the outer ring 22' is connected to the carrier member 11' by means of corner tabs 23' which function much in the same manner as in the previously discussed embodiment.

The interconnect tape 10' of FIG. 4 is viable for use with high lead count devices. It achieves many of the advantages of the embodiment of FIG. 1 including reduced thermal dissipation for improved inner lead bondability. However, the use of solid corners 39 for the inner ring 17' as compared to the yieldable corners 28 means that the leads 19' whose bases 20' are attached to the corners 39 may not be as uniformly stress relieved as those leads attached to the sides 18'. In order to minimize this problem, the structure shown in FIG. 4 would be made as thin as possible tending toward the lower range of thickness for TAB interconnect tapes.

It is apparent that in accordance with this invention it is possible to configure a tape interconnect with improved stress relief during inner lead bonding and/or reduced thermal dissipation during such bonding. This can be achieved in accordance with the present invention by using one or more rings and yieldable members or portions as described.

The patents and publication set forth in this specification are intended to be incorporated by reference herein.

It is apparent that there has been provided in accordance with this invention an improved interconnect tape for use in tape automated bonding which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. An interconnect tape for use in tape automated bonding comprising:
   a carrier member for supporting at least one pattern of interconnect leads;
   at least one first frame member having a plurality of sides, with each of said sides supporting a plurality of elongated interconnect leads extending inwardly of said frame member, said at least one frame member further including yieldable portion connecting each said side to adjacent said sides, said yieldable portions including means for allowing movement of each said side relative to adjacent said sides in any direction in a plane of said tape; and
   first means for reducing stresses in said leads and for reducing thermal dissipation during bonding of inner portions of said leads to an electronic device, said first means comprising a plurality of spaced apart yieldable members connecting each said side of said first frame member to said carrier member; whereby each said side can yield relative to said carrier member over substantially its entire length.

2. An interconnect tape as in claim 1 including second means for further reducing said stresses and said thermal dissipation during said bonding, said second means comprising at least one second frame member supported by said carrier member and arranged between said carrier member and said first frame member so that said first means connects said first frame member to said second frame member.

3. An interconnect tape as in claim 2 wherein said second frame member is supported by said carrier member by means of a plurality of widely spaced apart members substantially fewer in number than said yieldable members of said first means.

4. An interconnect tape as in claim 3 wherein said yieldable members connecting each said side of said first frame comprise at least two groups of said yieldable members with a first of said groups of yieldable members having a first orientation and extending from a first end of said side toward the opposing group of said yieldable members connecting said side, said opposing group of said yieldable members having an orientation in general opposition to said first orientation, whereby the forces on said side of said first frame member by said first group of yieldable members balances the forces exerted on said side by said opposing group of said yieldable members to better maintain the shape integrity of said interconnect tape.

5. An interconnect tape as in claim 4 wherein said carrier member, said at least one first frame member, said first means and said second means comprise a unitary metal foil.

6. An interconnect tape as in claim 4 comprising a multi-layer tape.

7. An interconnect tape for use in tape automated bonding comprising:
   a carrier member for supporting at least one pattern of interconnect leads;
   at least one first frame member having a plurality of sides, with each of said sides supporting a plurality of elongated interconnect leads extending inwardly of said frame member;
   first means for reducing stresses in said leads and for reducing thermal dissipation during bonding of inner portions of said leads to an electronic device, said first means comprising a plurality of spaced apart yieldable members connecting each said side of said first frame member to said carrier member, said yieldable members comprising at least two groups of said yieldable members with a first of said groups of yieldable members having a first orientation and extending from a first end of said side toward the opposing group of said yieldable members connecting said side, said opposing group of said yieldable members having an orientation in general opposition to said first orientation, whereby the forces exerted on said side of said first frame member by said first group of yieldable members balances the forces exerted on said side of said opposing group of said yieldable members to better maintain the shape integrity of said interconnect tape.

8. An interconnect tape as in claim 7 wherein said at least one first frame member includes yieldable portions connecting each said side to adjacent said sides, whereby each said side can yield relative to said carrier member over substantially its entire length.

9. An interconnect tape for use in tape automated bonding comprising:
   a carrier member for supporting at least one pattern of interconnect leads;
   at least one first frame member having a plurality of sides, with each of said sides supporting a plurality of elongated interconnect leads extending inwardly of said frame member;
   said at least one first frame further including yieldable portions connecting each said side to adjacent said sides;
   first means for reducing stresses in said leads and for reducing thermal dissipation during bonding of inner portion of said leads to an electronic device, said first means comprising a plurality of spaced apart yieldable members; and
   second means for further reducing said stresses and said thermal dissipation during said bonding, said second means comprising at least one second frame member supported by said carrier member and arranged between said carrier member and said first frame member so that said first means connects said first frame member to said second frame member;
   whereby each said side can yield relative to said carrier member over substantially its entire length.

10. An interconnect tape as in claim 9 wherein said yieldable members connecting each said side of said first frame comprise at least two groups of said yieldable members with a first of said groups of yieldable members having a first orientation and extending from a first end of said side toward the opposing group of said yieldable members connecting said side, said opposing group of said yieldable members having an orientation in general opposition to said first orientation, whereby the forces exerted on said side of said first frame member by said first group of yieldable members balances the forces exerted on said side by said opposing group of said yieldable members to better maintain the shape integrity of said interconnect tape.

11. An interconnect tape as in claim 9 wherein said second frame member is supported by said carrier member by means of a plurality of widely spaced apart members substantially fewer in number than said yieldable members of said first means.

12. An interconnect tape as in claim 9 wherein said at least one first frame member includes yieldable portions connecting each side to adjacent said sides, whereby each side can yield relative to said carrier member over substantially its entire length.

13. An interconnect tape as in claim 9 further including means arranged within said interconnect leads for reducing stresses during inner lead bonding.

14. An interconnect tape as in claim 9 wherein said carrier member, said at least one first frame member, said first means and said second means comprise a unitary metal foil.

15. An interconnect tape as in claim 9 comprising a multi-layer tape.

16. An interconnect tape for use in tape automated bonding comprising:
   a carrier member for supporting at least one pattern of interconnect leads;
   at least one first frame member having a plurality of sides with each of said sides supporting a plurality of elongated interconnect leads extending inwardly of said frame member;
   first means for reducing stresses in said leads and for reducing thermal dissipation during bonding of inner portions of said leads to an electronic device, said first means comprising a plurality of spaced apart yieldable members;
   second means for further reducing said stresses and said thermal dissipation during said bonding, said second means comprising at least one second frame member supported by said carrier member and arranged between said carrier member and said first frame member so that said first means connects said first frame member to said second frame member.

17. An interconnect tape as in claim 16 wherein said second frame member is supported by said carrier member by means of a plurality of widely spaced apart members substantially fewer in number than said yieldable members of said first means.

18. An interconnect tape as in claim 17 wherein said yieldable members connecting each said side of said first frame comprise at least two groups of said yieldable members with a first of said groups of yieldable members having a first orientation and extending from a first end of said side toward the opposing group of said yieldable members connecting said side, said opposing group of said yieldable members having an orientation in general opposition to said first orientation, whereby the forces exerted on said side of said first frame member by said first group of yieldable members balances the forces exerted on said side by said opposing group of said yieldable members to better maintain the shape integrity of said interconnect tape.

* * * * *

UNITED STATES PATENT AND TRADEMARK OFFICE
CERTIFICATE OF CORRECTION

PATENT NO. : 4,721,993
DATED : January 26, 1988
INVENTOR(S) : WALTER

It is certified that error appears in the above—identified patent and that said Letters Patent is hereby corrected as shown below:

Column 9, line 9, please delete "portion" and insert
---portions--- in its place.

Column 9, line 44, after "forces" please insert
---exerted---.

Column 10, line 33, please delete "portion" and insert
---portions--- in its place.

Signed and Sealed this

Seventh Day of January, 1992

Attest:

HARRY F. MANBECK, JR.

*Attesting Officer*  *Commissioner of Patents and Trademarks*